United States Patent
Ho et al.

(10) Patent No.: US 9,693,401 B2
(45) Date of Patent: Jun. 27, 2017

(54) DISPLAY DEVICE AND LIGHT-EMITTING ELEMENT

(71) Applicant: Sony Corporation, Tokyo (JP)

(72) Inventors: Justin Ho, Kanagawa (JP); Goshi Biwa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/024,260

(22) Filed: Sep. 11, 2013

(65) Prior Publication Data

US 2014/0077682 A1    Mar. 20, 2014

(30) Foreign Application Priority Data

Sep. 19, 2012    (JP) ................. 2012-205476

(51) Int. Cl.
| H01J 5/16 | (2006.01) |
| H05B 33/02 | (2006.01) |
| H01L 33/44 | (2010.01) |
| H01L 33/56 | (2010.01) |

(52) U.S. Cl.
CPC ............. *H05B 33/02* (2013.01); *H01L 33/44* (2013.01); *H01L 33/56* (2013.01)

(58) Field of Classification Search
CPC .............................. H01L 33/56; H01L 33/44
USPC .......................................... 313/117, 498, 506
See application file for complete search history.

(56) References Cited

U.S. PATENT DOCUMENTS

| 2002/0085143 A1 | 7/2002 | Kim et al. |
| 2006/0071233 A1* | 4/2006 | Cho et al. ...................... 257/103 |
| 2007/0164662 A1 | 7/2007 | Eida et al. |
| 2008/0137331 A1 | 6/2008 | Kaneko et al. |
| 2009/0140276 A1* | 6/2009 | Kuratate .......................... 257/98 |

FOREIGN PATENT DOCUMENTS

| CN | 1934604 A | 3/2007 |
| CN | 101202321 A | 6/2008 |
| CN | 100493287 | 5/2009 |
| JP | 08-116309 | 5/1996 |
| JP | 2002-278477 A | 9/2002 |
| JP | 2003-218392 A | 7/2003 |
| JP | 2003347041 | 12/2003 |
| JP | 2004-253389 A | 9/2004 |
| JP | 2005123088 | 5/2005 |

(Continued)

OTHER PUBLICATIONS

Sheng Liu, Xiaobing Luo, "LED Packaging for Lighting Applications: Design, Manufacturing, and Testing", John Wiley and Sons, 2011. (7 pages).

(Continued)

*Primary Examiner* — Vip Patel
(74) *Attorney, Agent, or Firm* — K&L Gates LLP

(57) ABSTRACT

There is provided a display device including a light-emitting element body part, a low refractive index layer part which is provided over a light output surface of the light-emitting element body part and has a first refractive index, and a packaging member which is provided to seal the light-emitting element body part and the low refractive index layer part inside the packaging member, has a planar light output surface, and has a second refractive index which is greater than the first refractive index.

17 Claims, 8 Drawing Sheets

(56) References Cited

FOREIGN PATENT DOCUMENTS

| | | |
|---|---|---|
| JP | 2005-322633 A | 11/2005 |
| JP | 2006-005340 A | 1/2006 |
| JP | 2006108093 | 4/2006 |
| JP | 2007-121994 A | 5/2007 |
| JP | 2008060092 | 3/2008 |
| JP | 2010033905 | 2/2010 |
| JP | 2010-058100 A | 3/2010 |
| JP | 2010-118273 | 5/2010 |
| JP | 2010161279 | 7/2010 |
| JP | 2011-034884 A | 2/2011 |
| JP | 2011-215550 A | 10/2011 |

OTHER PUBLICATIONS

Office Action issued in JP Application 2012205476, mailed May 10, 2016 (3 pages).
Office Action issued in CN Application 201310415078.5, mailed Apr. 5, 2016 (16 pages).
Chinese Office Action (with English translation) issued Oct. 19, 2016 in corresponding Chinese application No. 201310415078.5 (18 pages).

* cited by examiner

A

B

- LIGHT-EMITTING ELEMENT
- LED
- LOW REFRACTIVE INDEX LAYER PART

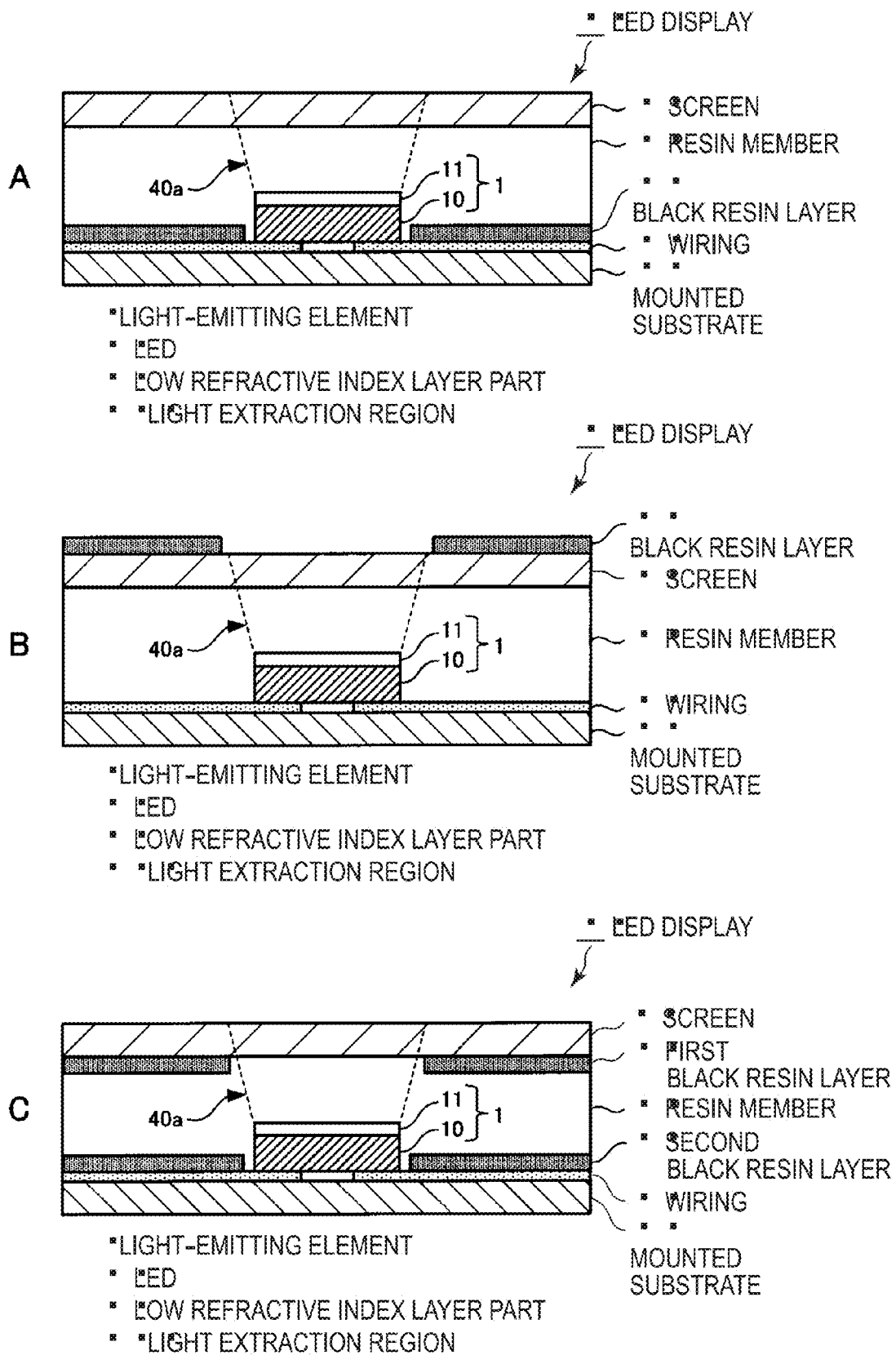

DISPLAY DEVICE AND LIGHT-EMITTING ELEMENT

CROSS REFERENCES TO RELATED APPLICATIONS

The present application claims priority to Japanese Priority Patent Application JP 2012-205476 filed in the Japan Patent Office on Sep. 19, 2012, the entire content of which is hereby incorporated by reference.

BACKGROUND

The present disclosure relates to a display device and a light-emitting element used for the display device.

In the past, a variety of display devices using light-emitting diodes (LEDs) as light-emitting elements were proposed. In a display device using LEDs (hereinafter referred to as LED displays), a plurality of LEDs are arranged two-dimensionally.

Further, in the past, or the LED displays having such a structure, a variety of techniques were proposed so as to improve light extraction efficiency. For example, in order to improve the light extraction efficiency, a technique to seal an LED in a resin capsule formed in a lens shape has been proposed (see Sheng Liu, Xiaobing Luo: "LED Packaging for Lighting Applications: Design, Manufacturing, and Testing", John Wiley and Sons, 2011, for example).

SUMMARY

As described above, in the past, a variety of techniques for improving the light-emitting efficiency were proposed for LED displays. However, in this technical field, in addition to the improvement in light extraction efficiency, a technique that enables downsizing of LED displays is also desired.

The present disclosure has been made in response to such a demand. According to an embodiment of the present disclosure, it is desirable to provide a display device that has excellent light extraction efficiency and enables downsizing, and a light-emitting element used for the display device.

According to an embodiment of the present disclosure, there is provided a display device including a light-emitting element body part, a low refractive index layer part, and a packaging member, and the low refractive index layer part and the packaging member are configured as follows. The low refractive index layer part is provided over a light output surface of the light-emitting element body part and has a first refractive index. The packaging member is provided to seal the light-emitting element body part and the low refractive index layer part inside the packaging member, has a planar light output surface, and has a second refractive index which is greater than the first refractive index.

According to another embodiment of the present disclosure, there is provided a light-emitting element including a light-emitting element body part and a low refractive index layer part provided over a light output surface of the light-emitting element body part. Further, in the light-emitting element of the embodiment of the present disclosure, the low refractive index layer part has a lower refractive index than a packaging member which has a planar light output surface and with which the light-emitting element body part is sealed inside the packaging member.

According to the embodiment of the present disclosure, the low refractive index layer part having a lower refractive index than the packaging member having the planar light output surface is provided over the light-emitting element body part. Accordingly, according to the embodiment of the present disclosure, it is possible to increase light components incident on the light output surface of the packaging member from the light-emitting element body part at an angle smaller than the critical angle of the total reflection of light at the light output surface of the packaging member.

As described above, according to the embodiment of the present disclosure, it is possible to increase light components incident on the light output surface of the packaging member from the light-emitting element body part at an angle smaller than the critical angle of the total reflection of light at the light output surface of the packaging member, and accordingly, excellent light extraction efficiency can be obtained. Further, according to the embodiment of the present disclosure, since the packaging member having the planar light output surface is used, the display device can be downsized. That is, according to the embodiment of the present disclosure, it is possible to provide a display device that has excellent light extraction efficiency and enables downsizing, and a light-emitting element.

Additional features and advantages are described herein, and will be apparent from the following Detailed Description and the figures.

BRIEF DESCRIPTION OF THE FIGURES

FIGS. 12A to 12C are cross-sectional views showing schematic structures of display devices according to modified examples 1 to 3, respectively.

DETAILED DESCRIPTION

Hereinafter, examples of light-emitting elements according to embodiments of the present disclosure and display devices including any of the light-emitting elements will be described with reference to drawings in the following order. Note that the present disclosure is not limited to examples below.

1. First Embodiment: Structure of Light-emitting Element
2. Second Embodiment: Structure of Display Device

1. First Embodiment: Structure of Light-Emitting Element

First, before a structure of a light-emitting element according to a first embodiment is described, problems that can occur in LED displays in the related art using LEDs when the LED displays are to be downsized will be specifically described.

In the LED display, in a case where each LED is sealed in a resin capsule formed in a lens shape as in a case in the related art, the total package of the LED tends to become large, so that the downsizing of the LED display is limited. As a measure to downsize the LED display by solving this problem, a measure to seal the LED with a packaging member having a planar light output surface can be considered. That is, it becomes possible to downsize the LED display by sealing the LED with the packaging member in which the light output surface has a planar surface, not a lens structure.

Figure 1:
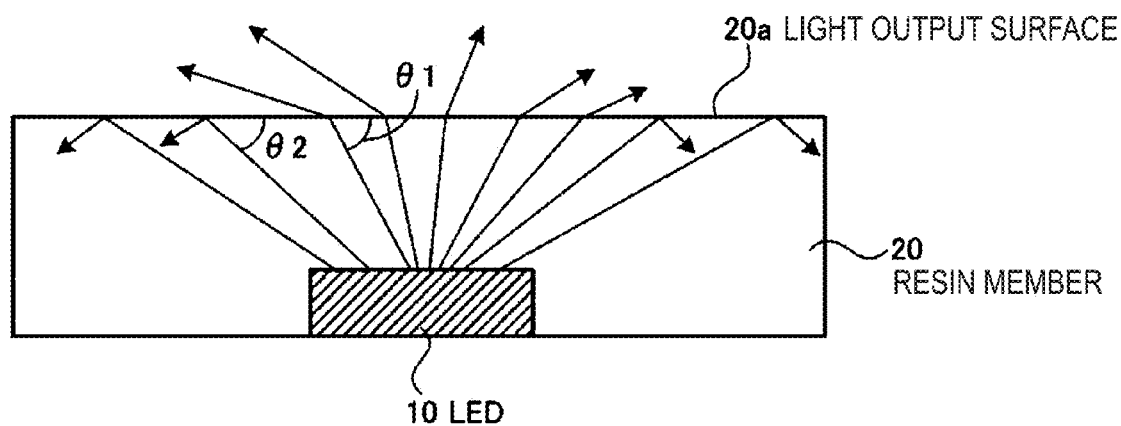
FIG. 1 is a view showing a light extraction operation in a light-emitting element (packaging mode of comparative example 1) in the related art.

This measure, however, causes a problem in that the light extraction efficiency is decreased. Referring to FIG. 1, this problem will be specifically described. Note that FIG. 1 is a view showing a light extraction operation in a case (packaging mode of comparative example 1) where an LED is sealed with a resin member (packaging member) having a planar light output surface.

Among light beams (black arrows) emitted from an LED 10, light components incident on a light output surface 20a of a resin member 20 at an angle θ1 that is greater than the critical angle (θ0 in FIG. 2 described later), at which the total reflection of light occurs, can be extracted outside from the light output surface 20a. On the other hand, light components incident on the light output surface 20a of the resin member 20 at an angle θ2 that is smaller than or equal to the critical angle of the total reflection are totally reflected by the light output surface 20a and fail to be extracted outside. Therefore, in a packaging mode of the LED 10 of the comparative example 1 shown in FIG. 1, the light extraction efficiency is decreased.

Therefore, in this embodiment, a structure of a light-emitting element by which excellent light extraction efficiency can be obtained even when the LED 10 is sealed with the resin member 20 having the planar light output surface 20a is proposed.

[Structure and Packaging Mode of Light-Emitting Element]

Figure 2:
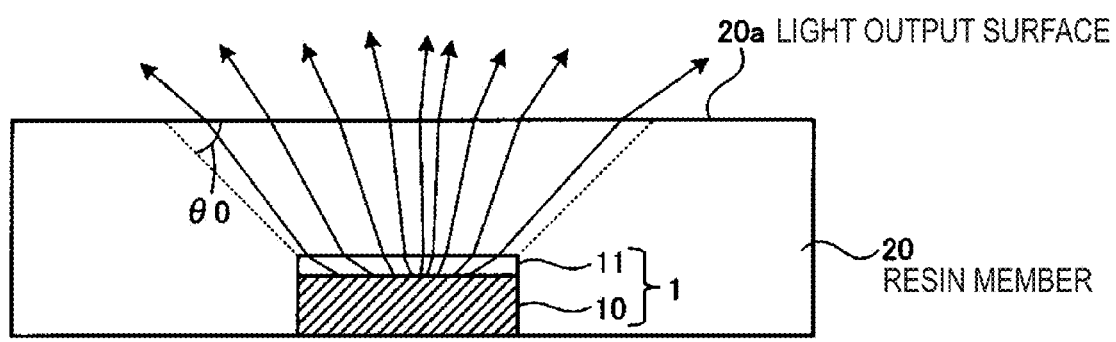
FIG. 2 is a view showing a schematic structure and a packaging mode of a light-emitting element according to a first embodiment of the present disclosure and a light extraction operation in the light-emitting element.

FIG. 2 is a view showing a cross-sectional structure and a packaging mode of the light-emitting element according to the first embodiment, and a light extraction operation in the light-emitting element. Note that in a structure of a light-emitting element 1 of this embodiment and a structure of the resin member 20 (packaging member) shown in FIG. 2, structures similar to those in the comparative example 1 shown in FIG. 1 are denoted by the same reference numerals.

The light-emitting element 1 includes the LED 10 (light-emitting element body) and a low refractive index layer part 11 provided over a light output surface of the LED 10. Note that the LED 10 can be formed with a given LED that is commercially available from the past, for example.

The low refractive index layer part 11 has a refractive index (first refractive index) that is smaller than a refractive index (second refractive index) of the resin member 20 with which the light-emitting element 1 is sealed. Note that the low refractive index layer part 11 can be formed using a given material as long as it is a material having a refractive index that is smaller than the refractive index of the resin member 20. For example, the low refractive index layer part 11 can be formed using $SiO_2$, an aerogel, or the like, or an air gap. In a case where the low refractive index layer part 11 is formed using $SiO_2$, for example, the refractive index can be controlled by an evaporation angle of $SiO_2$ and a refractive index of approximately 1.08 can be obtained. In a case where the low refractive index layer part 11 is formed using an aerogel, for example, a refractive index of approximately 1.01 can be obtained.

Further, the low refractive index layer part 11 can have a given thickness, and for example, a thickness of approximately 1 μm can be set. Note that the refractive index and the thickness of the low refractive index layer part 11 can be set as appropriate according to, for example, later-described conditions such as a size of a light extraction opening that is necessary for an LED display.

In the packaging mode of this embodiment, as shown in FIG. 2, a surface (light output surface of the light-emitting element 1) of the light-emitting element 1 on the low refractive index layer part 11 side having the above structure is sealed with the resin member 20 having the planar light output surface 20a.

Note that the resin member 20 can be formed using a given resin material as long as it is a resin material having a refractive index that is greater than the refractive index of the low refractive index layer part 11. Further, as in a later-described LED display of a second embodiment, in a case where a black resin layer and a screen are provided over the resin member 20, the resin member 20 is preferably formed using a material that is refractive-index-matched with these constituent members.

[Light Extraction Operation in Light-Emitting Element]

Next, the light-extraction operation in the packaging mode of the light-emitting element 1 of this embodiment shown in FIG. 2 will be described. First, light emitted from the LED 10 is incident on the resin member 20 through the low refractive index layer part 11. At this time, at an interface between the low refractive index layer part 11 and the resin member 20, the light travel direction is changed by a difference between the refractive indexes of the low refractive index layer part 11 and the resin member 20. Specifically, the refractive index of the low refractive index layer part 11 is smaller than that of the resin member 20, a light path is changed at the interface between the low refractive index layer part 11 and the resin member 20 to be closer to a thickness direction of the resin member 20 as shown in FIG. 2. That is, in this embodiment, an angle range of light emitted from the low refractive index layer part 11 becomes narrower (i.e., more limited) than in a case (comparative example 1) where the low refractive index layer part 11 is not provided.

In this case, among light beams (black arrows) emitted from the LED 10, the path of light components incident on the light output surface 20a of the resin member 20 at an angle smaller than the critical angle θ0 of the total reflectance is also changed similarly at the interface between the low refractive index layer part 11 and the resin member 20. As a result, some of these light components travel through the low refractive index layer part 11 and then the angle of the light travel direction to the light output surface 20a becomes larger than the critical angle θ0 of the total reflectance; therefore, the light can be extracted from the light output surface 20a to the outside.

That is, some of the light components that were not able to be extracted outside in the packaging mode of the comparative example 1 shown in FIG. 1 can be extracted outside by using the light-emitting element 1 of this embodiment. This operation will be specifically described with reference to FIGS. 3A and 3B.

Figure 3:
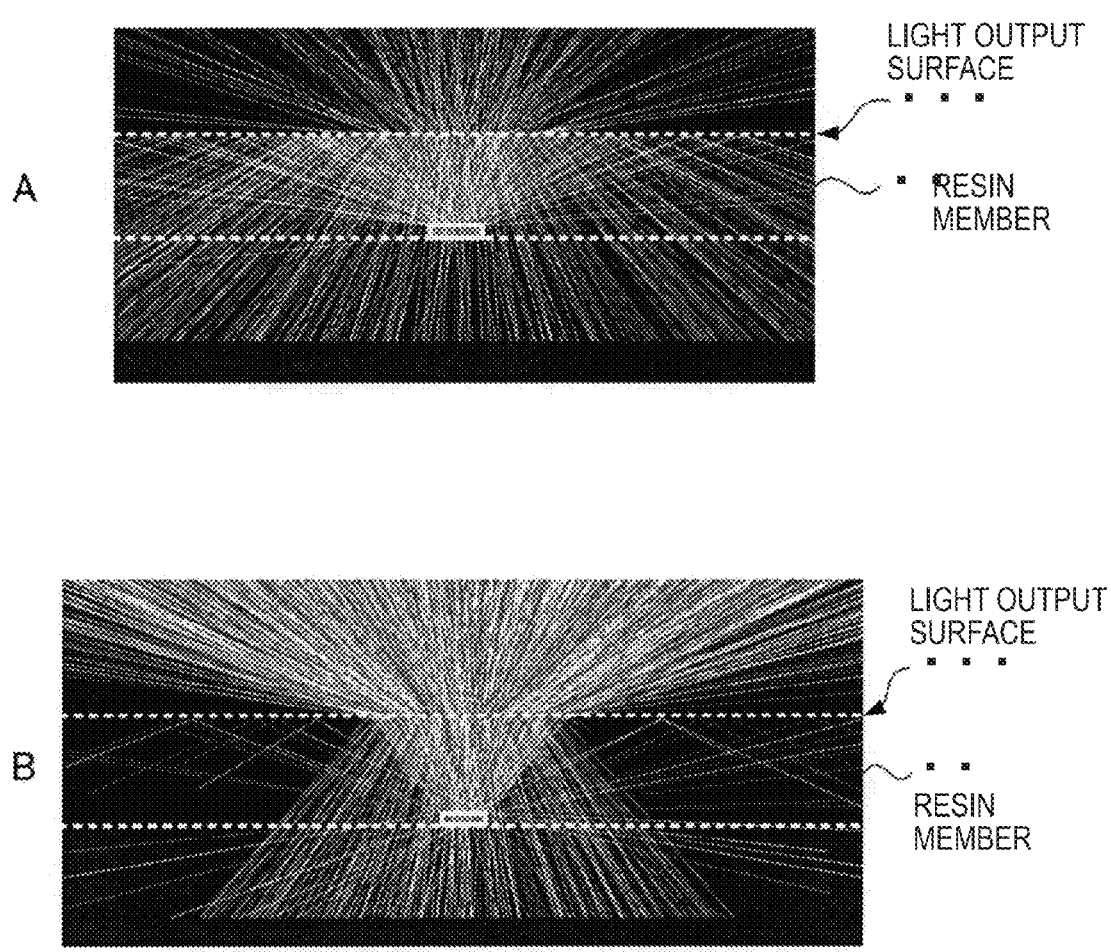
FIGS. 3A and 3B are views showing evaluation results of light path simulation performed on the packaging modes of the first embodiment and the comparative example 1.

FIG. 3A is a view showing a light path of light emitted from the LED 10 in the packaging mode of the comparative example 1 shown in FIG. 1, the light path being calculated by ray tracing simulation. Further, FIG. 3B is a view showing a light path of light emitted from the light-emitting element 1 in the packaging mode of this embodiment shown in FIG. 2, the light path being calculated by ray tracing simulation. Note that a rectangular area surrounded by a white line in FIG. 3A is an area where the LED 10 is disposed, and a rectangular area surrounded by a white line in FIG. 3B is an area where the light-emitting element 1 is disposed.

As is clear from comparison between FIGS. 3A and 3B, in a case of using the light-emitting element 1 of this embodiment, a range of light emitted from the light-emitting element 1 becomes more limited (an angle range of emitted light becomes narrower) than in a case of the comparative example 1. Further, as is clear from the comparison between FIGS. 3A and 3B, in a case of the packaging mode (light extraction mode) of the light-emitting element 1 of this embodiment, a larger amount of light is found to be extracted outside from the light output surface 20a than in the comparative example 1. This is because, by providing the low refractive index layer part 11 over the light output surface of the LED 10, more light components are incident on the light output surface 20a of the resin member 20 at an angle greater than the critical angle θ0 of the total reflection (light components reflected by total reflection become less) than in the comparative example 1.

As described above, by using the light-emitting element 1 of this embodiment, some of light components that were not able to be extracted outside in the structure of the comparative example 1 can be extracted outside. Therefore, in a case of using the light-emitting element 1 of this embodiment, the light extraction efficiency becomes higher than in the packaging mode of the comparative example 1 (FIG. 1).

[Packaging Modes of Comparative Examples 2 and 3]

Figure 4:
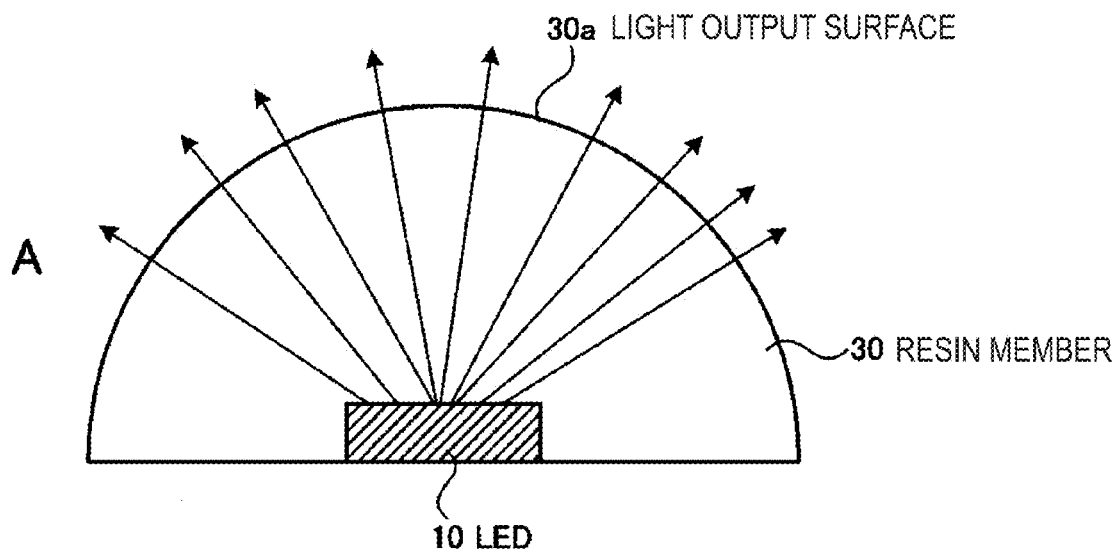
FIGS. 4A and 4B are views showing packaging modes of comparative examples 2 and 3, respectively.
Figure 4:
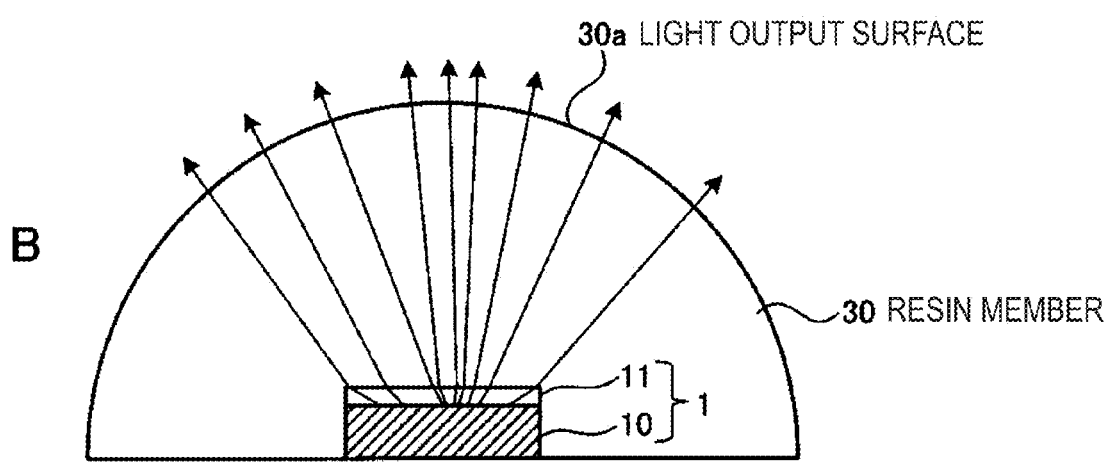

Further, the packaging mode (light extraction mode) of this embodiment will be compared here with a packaging mode (light extraction mode) in which the LED 10 is sealed in a resin capsule formed in a lens form as in the above related art. FIGS. 4A and 4B show the packaging modes.

FIG. 4A is a view showing a light extraction operation in a case (packaging mode of comparative example 2) where a light-emitting element that is not provided with the low refractive index layer part (the LED is provided alone) is sealed in the resin capsule formed in the lens shape. On the other hand, FIG. 4B is a view showing a light extraction operation in a case (packaging mode of comparative example 3) where a light-emitting element provided with the low refractive index layer part is sealed in the resin capsule formed in the lens shape. Note that in the packaging modes of the comparative examples 2 and 3 shown in FIGS. 4A and 4B, respectively, structures similar to those in the packaging mode of this embodiment shown in FIG. 2 are denoted by the same reference numerals.

As is clear from comparison between FIG. 4A and FIG. 1, the packaging mode of the comparative example 2 has a structure in which a resin member 30 having a light output surface 30a formed in the lens shape is used as the packaging member of the LED 10 in the packaging mode of the comparative example 1 shown in FIG. 1. Further, as is clear from comparison between FIG. 4B and FIG. 2, the packaging mode of the comparative example 3 has a structure in which the resin member 30 having the light output surface 30a formed in the lens shape is used as the packaging member of the LED 10 in the packaging mode of this embodiment shown in FIG. 2.

Figure 5:
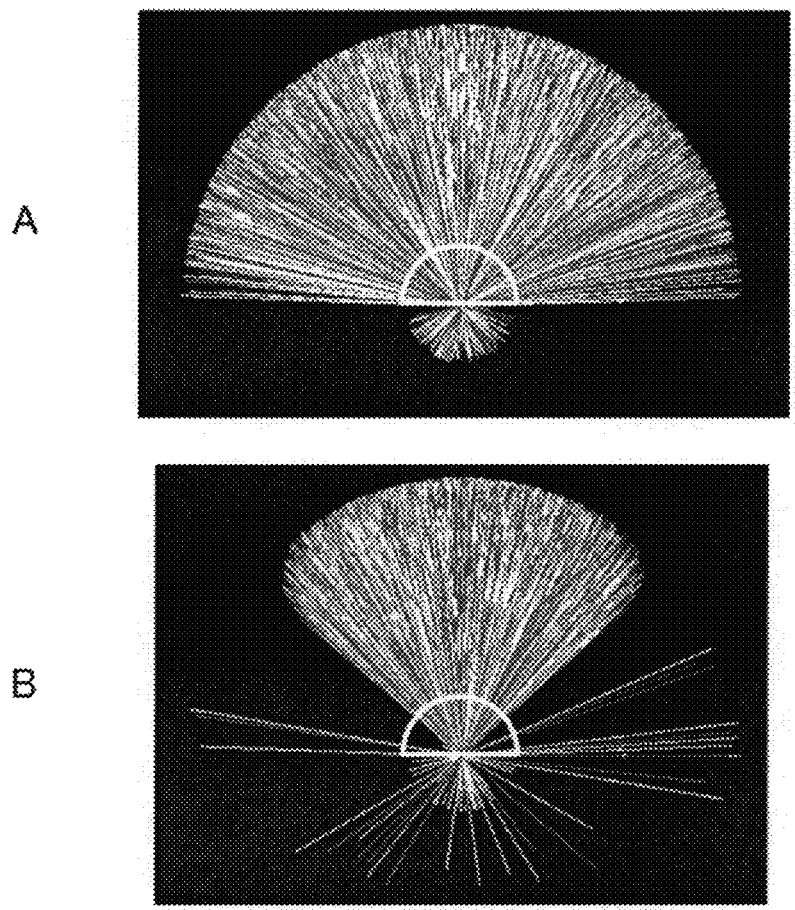
FIGS. 5A and 5B are views showing evaluation results of light path simulation performed on the packaging modes of the comparative examples 2 and 3, respectively.

Furthermore, FIGS. 5A and 5B show light paths of light emitted from the LED 10 (light-emitting element 1), the light paths being calculated by ray tracing simulation in the packaging modes of the comparative examples 2 and 3, respectively. Note that semicircle areas surrounded by white lines in FIGS. 5A and 5B are areas where the resin members 30 are disposed.

As is clear from comparison between FIGS. 5A and 5B, it is found that a range of light emitted from the light-emitting element 1 becomes more limited and that an angle range of the output light becomes narrower in the comparative example 3 than in the comparative example 2, because the low refractive index layer part 11 is provided over the light output surface of the LED 10 in the comparative example 3.

[Evaluation of Light Extraction Efficiency]

Here, in the above-described packaging modes (light extraction modes) of the first embodiment and the comparative examples 1 to 3, luminances of light output from the respective resin members are calculated by simulation and compared. Note that in this simulation analysis, a refractive index n of the low refractive index layer part 11 is set to a predetermined value (1.10) within a range from 1.07 to 1.2, and the refractive index of the resin member is set to 1.48. Evaluation results are shown in the following table. Note that the luminance of output light in the packaging mode of the comparative example 1 (FIG. 1) is set to 1 (reference), and its relative luminances are shown in the following table.

|  | Luminance |
| --- | --- |
| First embodiment | 1.29 |
| Comparative example 1 | 1.00 |
| Comparative example 2 | 2.34 |
| Comparative example 3 | 1.36 |

As is clear from the above table, in the packaging mode of this embodiment, the luminance is found to be increased by approximately 29% of the luminance of the packaging mode of the comparative example 1. That is, it is found that, in a case where the LED 10 (light-emitting element 1) is packaged with the resin member 20 having the planar light output surface 20a, by providing the low refractive index layer part 11 over the light output surface of the LED 10, the light extraction efficiency is improved.

Note that, as is clear from the above table, in the packaging mode of this embodiment, the luminance is found to be lower than in a case where the LED 10 (light-emitting element 1) is packaged with the resin member 30 having the lens-shaped light output surface 30a (comparative examples 2 and 3). However, in each of the packaging modes of the comparative examples 2 and 3, since the resin member 30 having the light output surface 30a formed in the lens shape is used as the packaging member, downsizing of the LED display is limited as described above. In contrast, in this embodiment, since the light-emitting element 1 is packaged with the resin member 20 having the planar light output surface 20a, the structure of this embodiment is superior to those of the comparative examples 2 and 3 in terms of downsizing of the LED display.

In addition, here, relations between the thickness of the low refractive index layer part 11 in the packaging mode (light extraction mode) of this embodiment and a luminance improvement rate and between the refractive index of the low refractive index layer part 11 and the luminance improvement rate are evaluated by simulation. The evaluation results are shown in FIG. 6 and FIG. 7.

Figure 6:
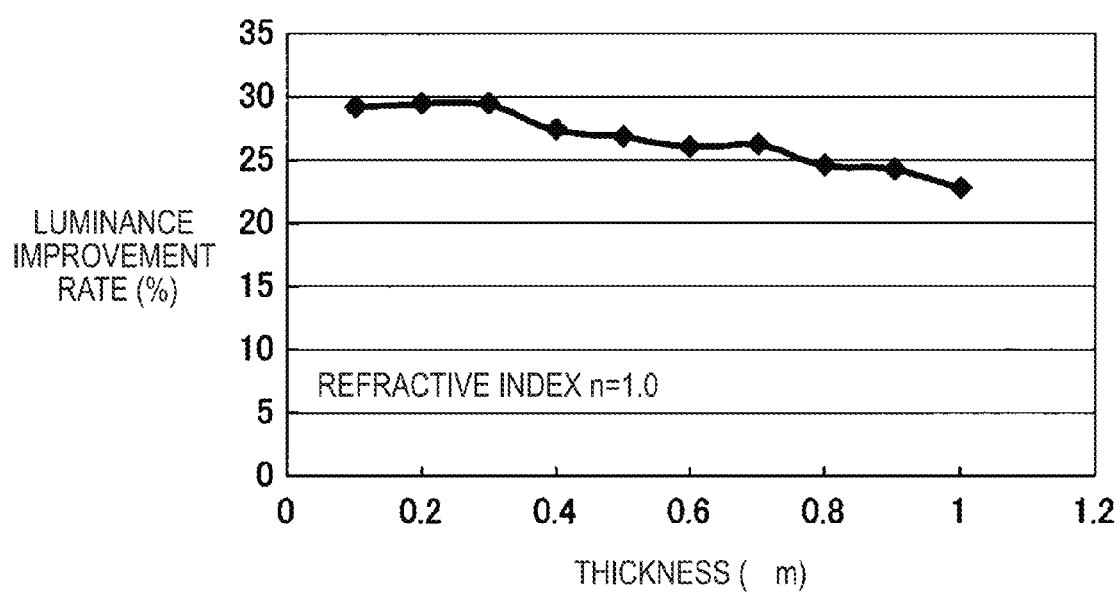
FIG. 6 is a view showing a relation between a thickness of a low refractive index layer part in the packaging mode of the first embodiment and a luminance improvement rate.
Figure 7:
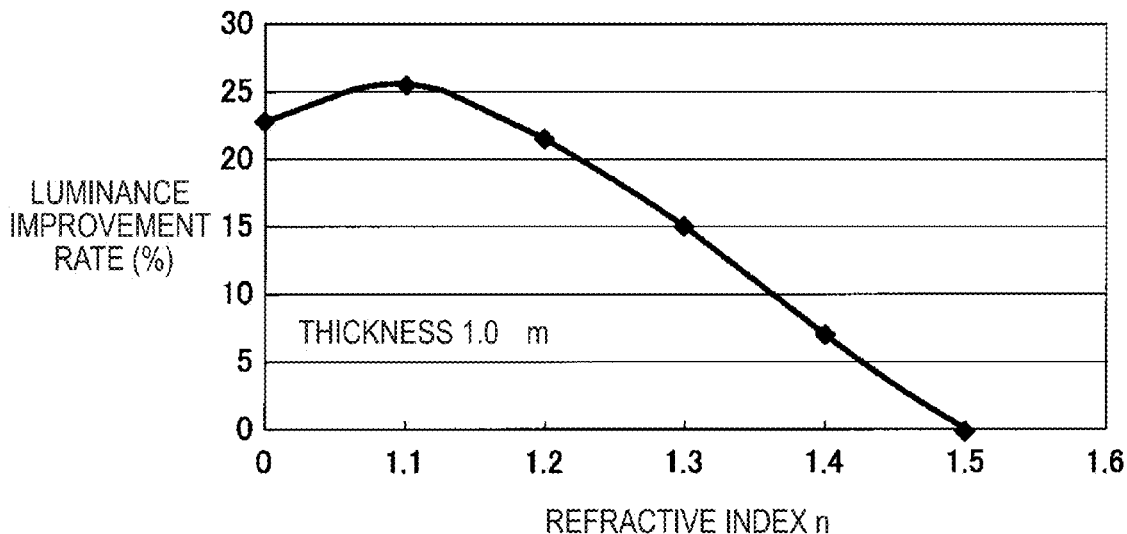
FIG. 7 is a view showing a relation between a refractive index of the low refractive index layer part in the packaging mode of the first embodiment and the luminance improvement rate.

FIG. 6 is a characteristic diagram showing the relation between the thickness of the low refractive index layer part 11 and the luminance improvement rate in a case where the refractive index n of the low refractive index layer part 11 is 1.0 (air gap) with the horizontal axis representing the thickness of the low refractive index layer part 11 and the vertical axis representing the luminance improvement rate. Further, FIG. 7 is a characteristic diagram showing the relation between the refractive index n of the low refractive index layer part 11 and the luminance improvement rate in a case where the thickness of the low refractive index layer part 11 is 1.0 μm with the horizontal axis representing the refractive index n of the low refractive index layer part 11 and the vertical axis representing the luminance improvement rate.

In this simulation analysis, the refractive index of a resin member is 1.48, the thickness of the resin member is 17 μm, and the critical angle θ0 of the total reflection is 42°. Further, in this simulation analysis, the luminance of the packaging mode of the comparative example 1 shown in FIG. 1 is used as a reference of the luminance improvement rate.

As is clear from FIG. 6, in the evaluated range of the thickness of the low refractive index layer part 11, it is found that the luminance (light extraction efficiency) is improved by providing the low refractive index layer part 11 over the LED 10. Further, as is clear from FIG. 7, it is found that the luminance (light extraction efficiency) is improved by lowering the refractive index n of the low refractive index layer part 11 to be lower than the refractive index (1.48) of the resin member.

From the above, by using the light-emitting element 1 of this embodiment as a light-emitting element of an LED display and sealing the light-emitting element 1 with the resin member 20 having the planar light output surface 20a, downsizing of the LED display and the excellent light extraction efficiency can be obtained.

2. Second Embodiment: Structure of Display Device

Next, a structure example of a display device according to a second embodiment of the present disclosure will be described. Note that in the description of this embodiment, an LED display is taken as an example of the display device.

[Structure of LED Display]

Figure 8:
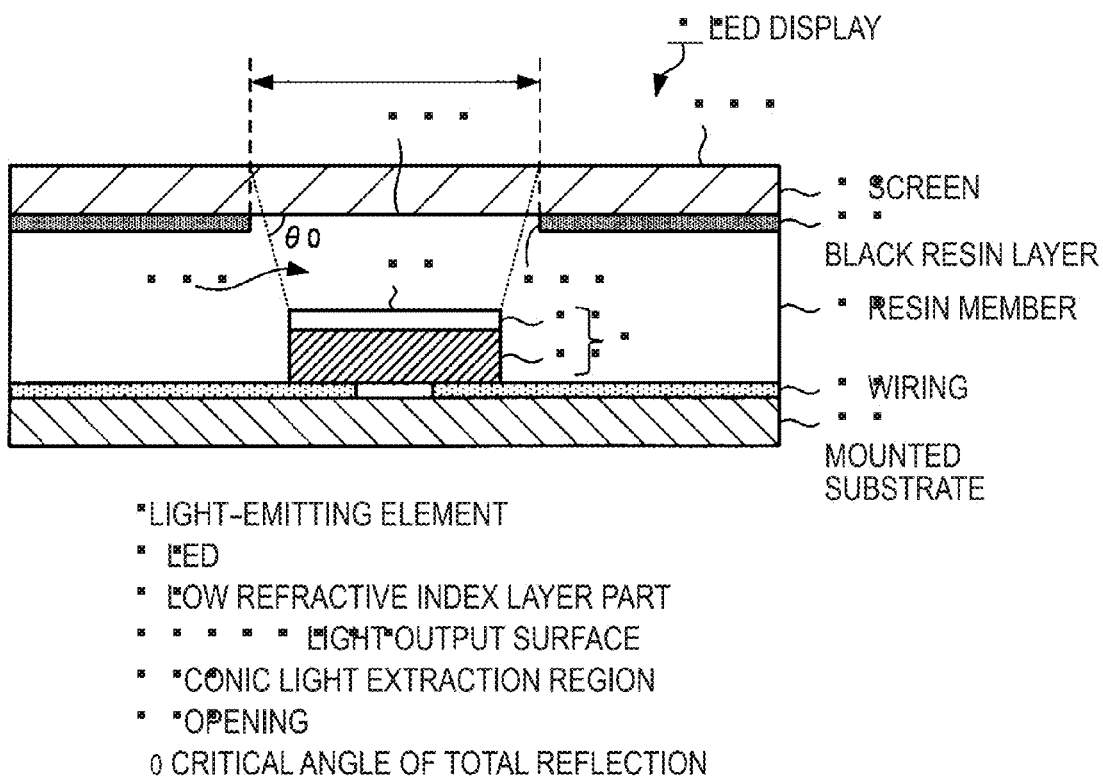
FIG. 8 is a cross-sectional view of a schematic structure of a display device according to a second embodiment of the present disclosure.

FIG. 8 shows a schematic structure of the LED display according to the second embodiment. FIG. 8 is a cross-sectional view of the schematic structure of the LED display of this embodiment. Note that in an LED display 40 of this embodiment shown in FIG. 8, structures similar to those in the packaging mode of the light-emitting element 1 of the above-described first embodiment shown in FIG. 2 are denoted by the same reference numerals.

The LED display 40 includes the light-emitting element 1, the resin member 20 (packaging member), a mounted substrate 41, a wiring 42, a black resin layer 43 (light-shielding layer), and a screen 44. Further, in this embodiment, over one surface of the mounted substrate 41, the wiring 42, the light-emitting element 1, the resin member 20, the black resin layer 43, and the screen 44 are stacked in this order. Note that although FIG. 8 shows the schematic structure near one light-emitting element 1 for simple description, actually, the LED display 40 includes a plurality of light-emitting elements 1 arranged two-dimensionally over the mounted substrate 41.

As in the first embodiment, the light-emitting element 1 includes the LED 10 and the low refractive index layer part 11 formed over the light output surface of the LED 10. Further, as in the first embodiment, the resin member 20 is formed using a sealing member (packaging member) having the planar light output surface 20a.

Note that in this embodiment, since the screen 44 and the black resin layer 43 are provided over the resin member 20, in order to reduce an influence of later-described external light reflection, the resin member 20 is formed using a resin that is refractive-index-matched with the screen 44 and the black resin layer 43. Further, also in this embodiment, as in the first embodiment, the refractive index of the low refractive index layer part 11 of the light-emitting element 1 is lower than that of the resin member 20.

The mounted substrate 41 can be formed using a given substrate as long as it is a substrate over which the light-emitting element 1 can be mounted, such as a glass substrate, for example. The wiring 42 is electrically connected to the LED 10 and feeds electric power to the LED 10.

The black resin layer 43 is formed to be embedded in a predetermined region of a surface of the resin member 20 on the screen 44 side. Note that the black resin layer 43 can be formed using a black resin material that is commercially available from the past.

Further, an opening 43a (light extraction opening) is provided in a region of the black resin layer 43 facing a light output surface 1a of the light-emitting element 1 (in a region right above the light output surface 1a). The size of the opening 43a is set so that an angle between the light output surface 20a and each straight line (dotted line in FIG. 8) connecting positions where end portions of the openings 43a are projected on the light output surface 44a of the screen 44 and positions of end portions of the light output surface 1a of the light-emitting element 1 is the critical angle θ0 of the total reflection. That is, over the light output surface 1a of the light-emitting element 1, a conic (conical shaped) light extraction region 40a with a side portion having an inclination with respect to the light output surface 20a at the critical angle θ0 of the total reflection is formed.

In the light-emitting element 1 of this embodiment, as described in the first embodiment, the low refractive index layer part 11 limits the range of light emitted from the LED 10; therefore, light can be efficiently output outside through the opening 43a of the black resin layer 43.

Note that in this embodiment, as shown in FIG. 8, an example in which an area of the conic (conical shaped) light extraction region 40a in the light output surface 20a of the resin member 20 is made smaller than an area of the opening 43a of the black resin layer 43 will be described; however, the present disclosure is not limited to this example. As long as the area of the opening 43a is greater than or equal to the area of the light extraction region 40a in the light output surface 20a of the resin member 20, the structure (e.g., area or shape) of the opening 43a of the black resin layer 43 can be arbitrarily set. Note that when the area of the opening 43a is too large, a later-described effect to reduce the influence of the external light reflection at the wiring 42 is reduced.

Therefore, in this embodiment, it is preferable that the opening 43a be formed so that the area of the opening 43a of the black resin layer 43 is substantially equal to the area of the light extraction region 40a in the light output surface 20a of the resin member 20.

The screen 44 is formed using a material (e.g., glass) having a light-transmitting property over the resin member 20 and the black resin layer 43.

[Function and Effects of Black Resin Layer]

Figure 10:
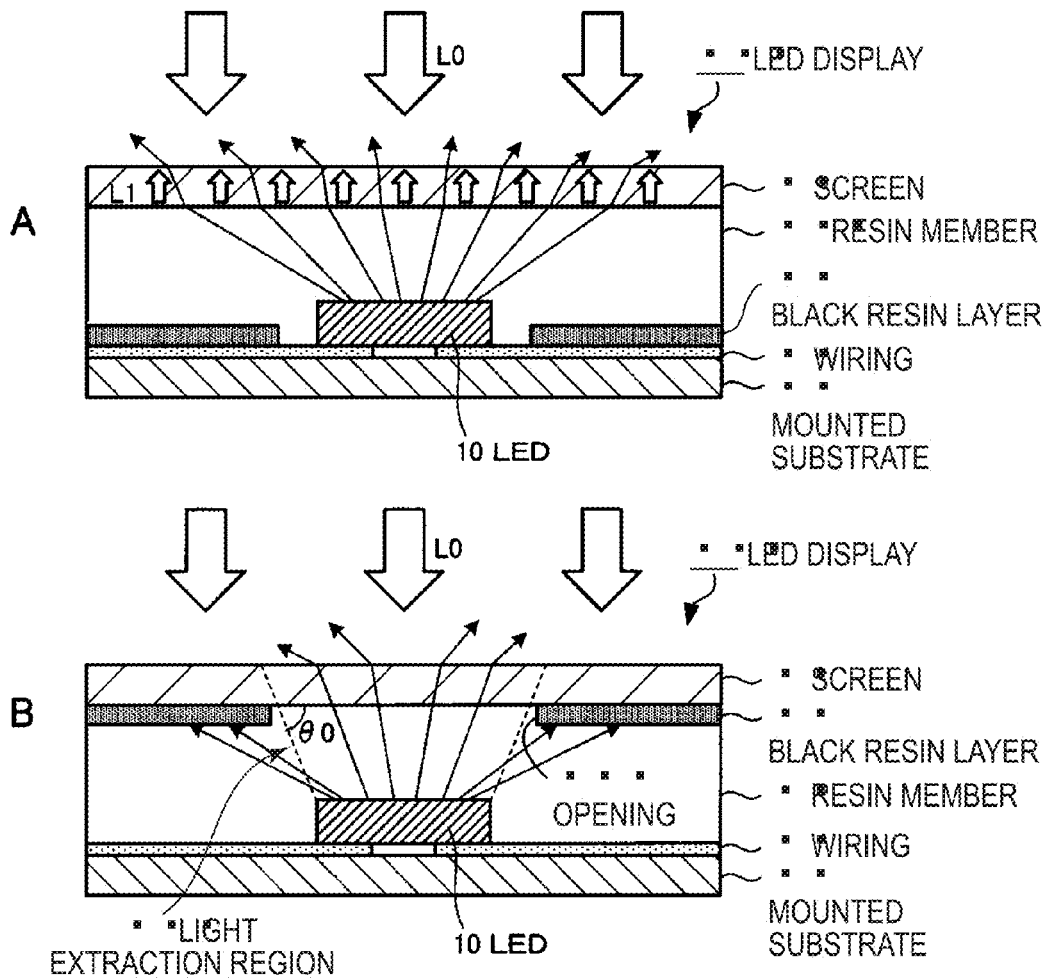
FIGS. 10A and 10B are views for explaining effects (function) of the black resin layer.
Figure 11:
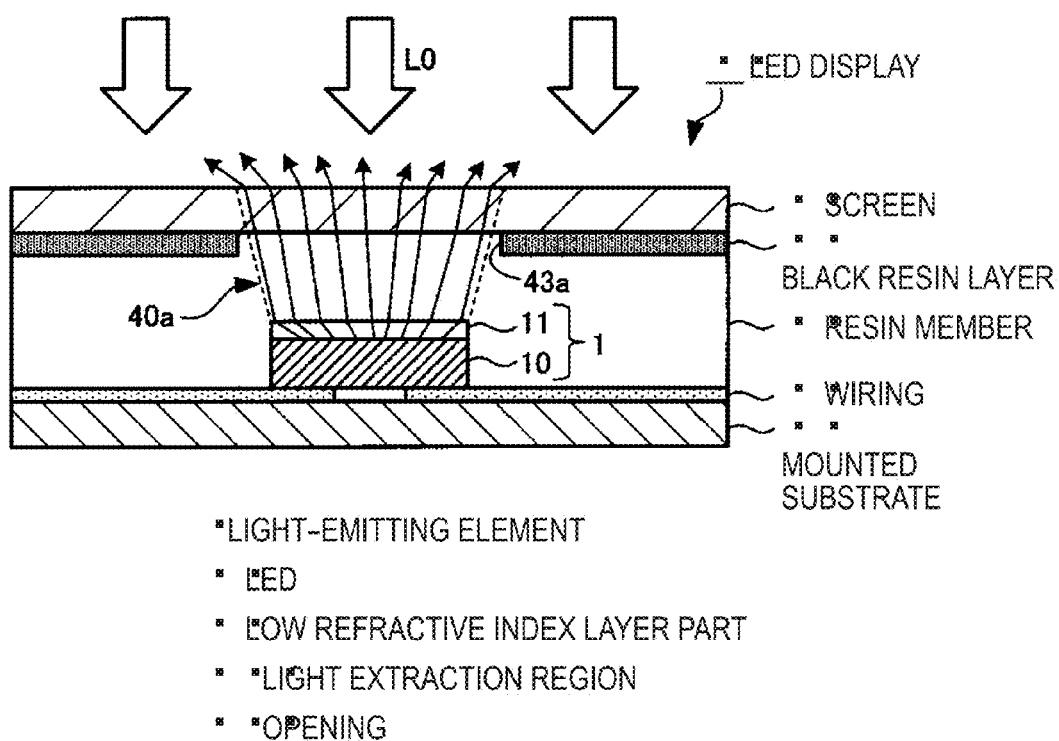
FIG. 11 is a view showing a light extraction operation in the display device of the second embodiment.

Next, effects that can be obtained by providing the black resin layer 43 in the LED display 40 of this embodiment will be described with reference to FIGS. 9 to 11.

Figure 9:
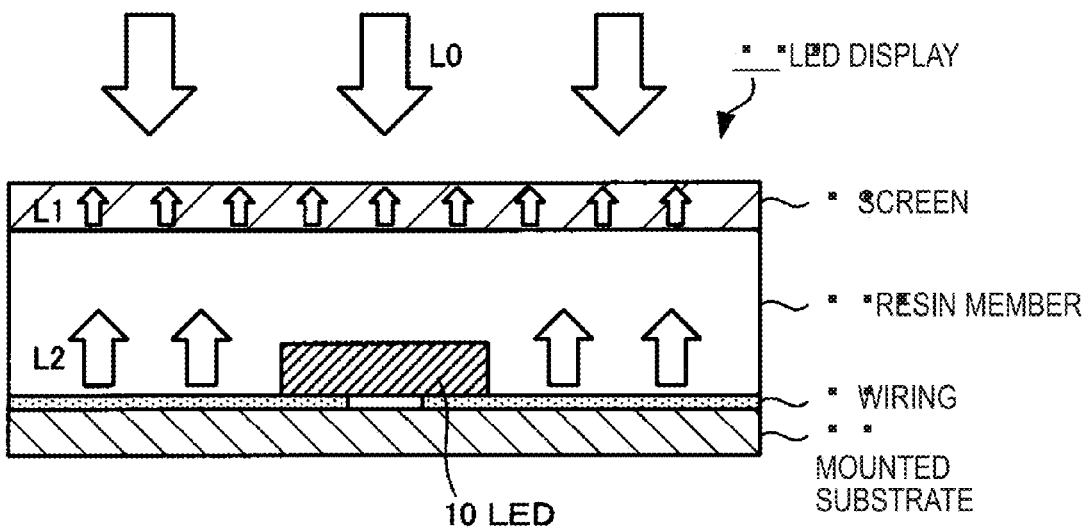
FIG. 9 is a view for explaining effects (function) of a black resin layer.

Note that FIG. 9 is a cross-sectional view showing a schematic structure of an LED display (comparative example 4) in a case where a light-emitting element that does not include a low refractive index layer part (an LED is provided alone) is sealed with a resin member having a planar light output surface. Further, FIGS. 10A and 10B are cross-sectional views of schematic structures of LED displays (comparative examples 5 and 6, respectively) each including the black resin layer 43 in an LED display including a light-emitting element that does not include the low refractive index layer part. Furthermore, FIG. 11 is a view showing a light extraction operation in the LED display 40 of this embodiment. Note that in each of the LED displays of the comparative examples shown in FIG. 9 and FIGS. 10A and 10B, structures similar to those in the LED display 40 of this embodiment shown in FIG. 8 are denoted by the same reference numerals.

An LED display 100 of the comparative example 4 has a structure in which, as shown in FIG. 9, the wiring 42, the LED 10, a resin member 101, and the screen 44 are stacked in this order over one surface of the mounted substrate 41. Further, in the LED display 100, the resin member 101 is formed using a low refractive index resin material. Note that the resin member 101 may include voids.

In the structure of the LED display 100 of the comparative example 4, external light L0 incident on the LED display 100 from around the LED display 100 is reflected by the screen 44, the wiring 42, and the like (see outlined arrows L1 and L2 in FIG. 9). In this case, an influence of the reflected light from the screen 44 and the wiring 42 might decrease contrast characteristics of the LED display 100. As measures to solve this problem, the following two measures can be given.

First, as a measure to suppress the reflected light from the wiring 42, a measure to provide the black resin layer 43 over a surface of the wiring 42 can be given, as shown in the LED display 110 (comparative example 5) in FIG. 10A. However, it is difficult to suppress the influence of external light components (outline arrows L1 in FIG. 10A) reflected by the screen 44 by this measure.

As another measure to solve the above problem, a measure to form the LED display as an LED display 120 (comparative example 6) shown in FIG. 10B can be given. In the LED display 120 of the comparative example 6, the black resin layer 43 is provided between the screen 44 and the resin member 20, and the opening 43a is provided over the LED 10, in a region corresponding to the light extraction region 40a in the black resin layer 43. Further, in the LED display 120 of the comparative example 6, the resin member 20 with which the LED 10 is sealed is formed using a resin material that is refractive-index-matched with the black resin layer 43 and the screen 44 as in this embodiment.

In this case, the external light reflection by the screen 44 can be suppressed. Further, when seen from an incident side of the external light L0, the wiring 42 is hidden behind the black resin layer 43 in this structure, and accordingly, the external light reflection by the wiring 42 can also be suppressed. However, since a low refractive index layer part is not provided over the LED 10 in the LED display 120 of the comparative example 6, light components incident on the screen 44 from the LED 10 at an angle smaller than the critical angle θ0 of the total reflection are absorbed in the black resin layer 43, and it is difficult to extract the light components to the outside. Therefore, although the influence of the external light reflection (decrease in contrast) can be suppressed, the light extraction efficiency is decreased in the LED display 120 of the comparative example 6.

Unlike in the structure of the comparative examples 5 and 6, in the LED display 40 of this embodiment, the black resin layer 43 is provided between the screen 44 and the resin member 20; therefore, as in the comparative example 6, the influence of the external light reflection (decrease in contrast) can be suppressed. Further, since the low refractive index layer part 11 is provided over the LED 10 in the LED display 40 of this embodiment, as shown in FIG. 11, light components incident on the screen 44 from the light-emitting element 1 at an angle smaller than the critical angle θ0 of the total reflection can be increased. That is, in this embodiment, most of light components emitted from the light-emitting element 1 are output outside through the opening 43a (conic light extraction region 40a) of the black resin layer 43, and accordingly, the light extraction efficiency can be increased.

From the above, in this embodiment, the LED display 40 superior in both light extraction efficiency and contrast characteristics can be provided. Further, in this embodiment, since the light-emitting element 1 is sealed (packaged) with the resin member 20 having the planar light output surface, the LED display 40 (flat panel display) with a small footprint can be provided.

Note that in the second embodiment, the example in which the layer formed using the black resin material is used as the light-shielding layer for removing the influence of the external light L0 is described, the present disclosure is not limited to this example. In the second embodiment, a given film can be used to form the light-shielding layer as long as it is a film having the same light-shielding function as the black resin layer 43.

Further, in the second embodiment, the structure example in which the black resin layer 43 is provided between the screen 44 and the resin member 20 is described, the present disclosure is not limited to this structure example. The black resin layer 43 can be disposed at a given position as long as, as in the second embodiment, the high light extraction efficiency is maintained and more improved contrast characteristics of the LED display than in a case where the black resin layer 43 is not provided is obtained. A variety of modified examples (modified examples 1 to 3) are shown in FIGS. 12A to 12C. FIGS. 12A to 12C are cross-sectional views showing schematic structures of LED displays of the modified examples 1 to 3, respectively. Note that in the respective LED displays of the modified examples shown in FIGS. 12A to 12C, structures similar to those in the LED display 40 of the second embodiment shown in FIG. 8 are denoted by the same reference numerals.

In an LED display 51 of the modified example 1, as shown in FIG. 12A, the black resin layer 43 is provided over the wiring 42 and in a position that does not overlap with the region where the light-emitting element 1 is disposed.

Further, in an LED display 52 of the modified example 2, as shown in FIG. 12B, the black resin layer 43 is provided over the light output surface of the screen 44. Note that in this example, as in the second embodiment, the black resin layer 43 is formed in a region that does not overlap with the conic (conical shaped) light extraction region 40a formed above the light output surface 1a of the light-emitting element 1.

Furthermore, in an LED display 53 of the modified example 3, as shown in FIG. 12C, two black resin layers (first black resin layer 54 and second black resin layer 55) are provided. In the modified example 3, the first black resin layer 54 is provided to be embedded in the light output surface of the resin member 20 as in the second embodiment, and the second black resin layer 55 is provided over the wiring 42 as in the modified example 1.

Also in the LED displays of the modified examples 1 to 3, the influence of the external light reflection by the screen 44 and/or the wiring 42 can be reduced more than in a case where the black resin layer 43 is not provided, and the contrast characteristics of the LED displays can be improved.

Although in the second embodiment, the LED display 40 including the black resin layer 43 and the screen 44 is described, the present disclosure is not limited to this example. For example, a structure in which the black resin layer 43 and the screen 44 are not provided and the resin member 20 also functions as the screen is possible.

Note that in the display device (LED display) of an embodiment of the present disclosure, unlike in the comparative example 1, light components guided within a plane of the resin member 20 can be reduced by increasing the light extraction efficiency. Accordingly, according to the embodiment of the present disclosure, the following effects can also be obtained.

Light guided within the resin member 20 is eventually absorbed in the resin member 20 and peripheral members; however, in this case, strong light emitted from the LED 10 might degrade the resin member 20 and the peripheral members. Specifically, a sealing resin generally used in an LED display, such as an epoxy resin, an acrylic resin, or silicone, for example, has problems on degradation, such as coloring and shrinking by absorbing light or generation of a gas, for example.

However, in the LED display of an embodiment of the present disclosure, light components guided within the resin member 20 can be reduced as described above; therefore, an influence of such a problem can be suppressed and an lifetime of the LED display can be increased. Further, in a case where the black resin layer 43 is provided as in the second embodiment, light components guided within the resin member 20 can be further reduced. Therefore, in the embodiment of the present disclosure, a resin that is easily changed with light, such as a light plastic resin or a light curable resin, can be used in a region where the LED 10 (light-emitting element 1) is sealed. That is, the resin member 20 can be formed using a resin such as a light plastic resin or a light curable resin.

Further, in a display device of an embodiment of the present disclosure, a thin film transistor (TFT) for driving the LED or a circuit (light-emitting element driver circuit) such as an IC (integrated circuit) chip can be disposed adjacent to the LED 10 (light-emitting element 1).

In a case where such a TFT or an IC chip is provided in a region sealed with the resin member 20, carriers excited by light emitted from the LED 10 might cause malfunction of the TFT or the IC chip. However, in the LED display of the embodiment of the present disclosure, light components guided within the resin member 20 can be reduced as described above, and the light extraction efficiency is not decreased even when the black resin layer 43 is provided. Therefore, in the display device of the embodiment of the present disclosure, even when the TFT for LED driving or the IC chip is disposed adjacent to the LED 10 (light-emitting element 1), stable driving is possible without decreasing the luminance and a contrast ratio.

Further, the examples in which the LEDs are used as light sources are described in the first and second embodiments, the present disclosure is not limited to these examples. For example, a self-luminous light source such as organic electroluminescence (EL) or inorganic EL may also be used as the light source. Alternatively, pseudo-light source using light passing through a micro opening, such as a light-transmitting part included in each pixel of a micro electro mechanical system (MEMS) display, for example, may also be used as the light source.

It should be understood by those skilled in the art that various modifications, combinations, sub-combinations and alterations may occur depending on design requirements and other factors insofar as they are within the scope of the appended claims or the equivalents thereof.

Additionally, the present application may also be configured as below.

(1) A display device including:
 a light-emitting element body part;
 a low refractive index layer part which is provided over a light output surface of the light-emitting element body part and has a first refractive index; and
 a packaging member which is provided to seal the light-emitting element body part and the low refractive index layer part inside the packaging member, has a planar light output surface, and has a second refractive index which is greater than the first refractive index.

(2) The display device according to (1), further including:
 a light-shielding layer provided in a region which does not overlap with an extraction region of light output from the light-emitting element body part through the low refractive index layer part.

(3) The display device according to (2),
 wherein the light-shielding layer is provided at a predetermined position on a light output surface side of the light-emitting element body part.

(4) The display device according to (2) or (3),
 wherein the light-shielding layer includes a black resin.

(5) The display device according to any one of (1) to (4), further including:
 a screen provided over the packaging member,
 wherein the packaging member includes a member which is refractive-index-matched with the screen.

(6) The display device according to any one of (1) to (5),
 wherein the packaging member includes a resin member including any of a light plastic resin and a light curable resin.

(7) The display device according to any one of (1) to (6), further including:
 a light-emitting element driver circuit which is provided in the packaging member and drives the light-emitting element body part.

(8) A light-emitting element including:
 a light-emitting element body part; and
 a low refractive index layer part which is provided over a light output surface of the light-emitting element body part and has a lower refractive index than a packaging member which has a planar light output surface and with which the light-emitting element body part is sealed inside the packaging member.

It should be understood that various changes and modifications to the presently preferred embodiments described The invention is claimed as follows:

1. A display device comprising:
   a light-emitting element body part;
   a low refractive index layer part which is provided over a light output surface of the light-emitting element body part and has a first refractive index;
   a resin member which is provided to seal the light-emitting element body part and the low refractive index layer part inside the resin member, wherein the resin member has a planar top light output surface and has a second refractive index which is greater than the first refractive index;
   a light-shielding layer is provided in the resin member, wherein the light-shielding layer includes an opening, and wherein the opening faces the light output surface of the emitting element body part.

2. The display device according to claim 1, wherein the light-shielding layer is provided in a region which does not overlap with the light-emitting element body part in a top view of the display device.

3. The display device according to claim 2, wherein the light-shielding layer is provided at a predetermined position adjacent to the top light output surface side of the resin member.

4. The display device according to claim 2, wherein the light-shielding layer includes a black resin.

5. The display device according to claim 2, wherein the light-shielding layer is disposed at a predetermined position opposite to the top light output surface side of the resin member.

6. The display device according to claim 2, further comprising a black resin layer, wherein the black resin layer is provided on a side near the light-emitting element body part and the black resin layer is in the resin member.

7. The display device according to claim 6, wherein the light-shielding layer is provided at a position adjacent to the top light output surface side of the resin member and wherein the light-shielding layer spaces apart from the black resin layer.

8. The display device according to claim 1, further comprising:
   a screen provided over the resin member,
   wherein the resin member includes a member which is refractive-index-matched with the screen.

9. The display device according to claim 1,
   wherein the resin member includes at least one of a light plastic resin and a light curable resin.

10. The display device according to claim 1, further comprising:
    a light-emitting element driver circuit which is provided in the resin member and is configured to drive the light-emitting element body part.

11. The display device according to claim 1, wherein the planar top light output surface of the resin member is perpendicular to a direction of a stacked order of a light emitting element.

12. The display device according to claim 1, wherein the light-emitting element body part is provided in the opening of the light-shielding layer with a cap between the light-emitting element body part and the light-shielding layer.

13. The display device according to claim 1, wherein the opening of the light-shielding layer is larger than the low refractive index layer.

14. The display device according to claim 1, wherein the opening of the light-shielding layer is configured to allow a total reflection of light from the light-emitting element body part at an edge portion of the opening.

15. A light-emitting element comprising:
    a light-emitting element body part;
    a low refractive index layer part which is provided over a light output surface of the light-emitting element body part and has a lower refractive index than a resin member which has a planar top light output surface and wherein the light-emitting element body part is sealed inside by the resin member;
    a light-shielding layer is provided in the resin member, and
    wherein the light-shielding layer includes an opening, and wherein the opening faces the light output surface of the emitting element body part.

16. The light-emitting element according to claim 15, wherein the resin member includes at least one of a light plastic resin and a light curable resin.

17. The light-emitting element according to claim 15, further comprising:
    a light-emitting element driver circuit which is provided in the resin member and is configured to drive the light-emitting element body part.

* * * * *